United States Patent [19]

Doyle et al.

[11] Patent Number: 5,717,560
[45] Date of Patent: Feb. 10, 1998

[54] ESD PROTECTION DEVICE USING STATIC CAPACITANCE COUPLING BETWEEN DRAIN AND GATE

[75] Inventors: Brian S. Doyle, Cupertino; Timothy J. Maloney, Palo Alto, both of Calif.

[73] Assignee: Intel Corporation, Santa Clara, Calif.

[21] Appl. No.: 701,960

[22] Filed: Aug. 23, 1996

[51] Int. Cl.$^6$ ............................................. H02H 9/00
[52] U.S. Cl. ............................................. 361/56; 361/111
[58] Field of Search ............................................. 361/56, 91, 111, 361/118, 54; 257/355

[56] References Cited

U.S. PATENT DOCUMENTS 4,423,431 12/1983 Sasaki ............................................. 361/56

OTHER PUBLICATIONS

C. Duvvury et al. "Dynamic Gate Coupling of NMOS for Efficient Output ESD Protection," IRPS Proceedings, 1992, pp. 141-150.

S. Dabral, R. Aslett, and T. Maloney, "Core Clamps for Low Voltage Technologies," 1994, EOS/ESD Symposium Proceedings, pp. 141-149.

*Primary Examiner*—Jeffrey A. Gaffin
*Assistant Examiner*—Salley C. Medley
*Attorney, Agent, or Firm*—Blakely, Sokoloff, Taylor & Zafman

[57] ABSTRACT

A method and an apparatus protecting an integrated circuit from electrostatic discharge. In one embodiment, a method of coupling the gate of an ESD protection transistor high during an ESD event to ensure a more efficient protection device is described. The method uses static fixed parallel plate capacitances coupled to the gate of an ESD protection device to place the ESD protection device above threshold during an ESD event. The fixed parallel plate capacitances form capacitors between the gate-and-drain and gate-and-source of the ESD protection device resulting in static capacitive gate coupling which is more calculable and controllable. The ratios of the capacitances are set so as to bias the gate of the ESD protection device above threshold during an ESD event, thus allowing the ESD protection device to sink current during the ESD event.

10 Claims, 3 Drawing Sheets

FIG. 1 *(PRIOR ART)*

ESD PROTECTION DEVICE USING STATIC CAPACITANCE COUPLING BETWEEN DRAIN AND GATE

BACKGROUND OF THE INVENTION

1. Field of the Invention

The present invention relates generally to electrostatic discharge protection and more specifically, the present invention relates to a method and apparatus for providing electrostatic discharge protection for integrated circuits.

2. Description of the Related Art

As is well known, the accumulation of static charge may lead to extremely high voltages near an integrated circuit. Electrostatic discharge (ESD) refers to the phenomenon of the electrical discharge of high current for a short duration of time resulting from the accumulation of static charge on an integrated circuit package or on a nearby human being handling that particular integrated circuit package. ESD is a serious problem for semiconductor devices since it has the potential to destroy an entire integrated circuit. Since ESD events occur often across the silicon circuits attached to the package nodes, circuit designers have concentrated their efforts on developing adequate protection measures for these sensitive circuits. Ideally, an ESD device should be able to protect an integrated circuit against any conceivable static discharge by passing large currents in a short time and in a non-destructive manner.

In many prior art ESD structures, an n-channel transistor clamp is used to protect integrated circuits. These prior art techniques rely on an n-channel transistor coupled between power supply and ground whose gate has been tied to the source. As an ESD pulse is applied to the drain, the transistor goes through the punch-through and then into the snap-back regions of operation. The electric current from the ESD pulse is thus sunk in the clamped n-channel transistor.

For better protection, other prior art techniques bias the gate of the n-channel transistor above threshold during an ESD event. FIG. 1 shows a schematic of a prior art ESD protection circuit 101 including n-channel transistor 103 coupled between $V_{DD}$ 111 and $V_{SS}$ 113. N-channel transistor 105 is coupled between the gate of n-channel transistor 103 and $V_{SS}$ 113. PAD 109 is coupled to the drain of n-channel transistor 103 as well as the gate of n-channel transistor 105. With an ESD event occurring on PAD 109, the gate of n-channel transistor 103 is capacitively coupled upward through the parasitic capacitance 107 of n-channel transistor 105. Accordingly, with the ESD transient, the drain of n-channel transistor 103 is at a high potential and the gate of n-channel transistor 103 is temporarily pulled above threshold voltage $V_T$ which is adequate for n-channel transistor 103 to sink the electric current from the ESD pulse. Eventually, n-channel transistor 103 is turned off through n-channel transistor 105 as the gate of n-channel transistor 103 is pulled down to $V_{SS}$ 113.

Although prior art ESD protection circuit 101 provides ESD protection, it suffers from the disadvantage of being dependent on the time constant due to the capacitive coupling of the gate of n-channel transistor 103. That is, since ESD pulses can vary in time and magnitude, the efficiency of the gate coupling depends intimately on the size and the capacitances of the system. On the one hand, for short ESD pulses, parasitic capacitance 107 should be small thus requiring n-channel transistor 105 to be small. Otherwise, an excessively high voltage will be applied to the gate of n-channel transistor 103. On the other hand, in order to accommodate slow transient ESD possibilities, parasitic capacitance 107 must be large and would thus require n-channel transistor 105 to be oversized.

Thus, what is desired is an improved ESD protection device for integrated circuits. Such an improved ESD protection device would sink the electric current during an ESD event with reduced sensitivity to the time scale of the ESD event. In addition, such a device would allow an n-channel transistor coupled between power and ground to have its gate fixed to a voltage in a much more controllable manner in comparison with the transient coupling protection of the prior art.

SUMMARY OF THE INVENTION

A method and an apparatus for protecting an integrated circuit from electrostatic discharge is disclosed. In one embodiment, a first transistor is coupled between a first potential and a second potential. The gate of the first transistor is capacitively coupled to the first potential through a first capacitor. The gate of the first transistor is further capacitively coupled to the second potential through a second capacitor. During an ESD event, the gate of the first transistor is biased above a threshold voltage through the first and second capacitors. Additional features and benefits of the present invention will become apparent from the detailed description, figures and claims set forth below.

BRIEF DESCRIPTION OF THE DRAWINGS

The present invention is illustrated by way of example and not limitation in the accompanying figures.

DETAILED DESCRIPTION

A method and an apparatus for protecting an integrated circuit from electrostatic discharge (ESD) is disclosed. In the following description, numerous specific details are set forth in order to provide a thorough understanding of the present invention. It will be apparent, however, to one having ordinary skill in the arts that the specific details need not be employed to practice the present invention. In other instances, well known materials or methods have not been described in detail in order to avoid obscuring the present invention.

The present invention offers a method and an apparatus coupling the gate of the ESD protection transistor high during ESD events to ensure a more efficient protection device. The method and apparatus described herein uses fixed static capacitances to couple the gate of the ESD device above threshold voltage during an ESD event that results in a gate coupling which is more calculable and controllable in comparison with prior art ESD protection devices.

Figure 1:
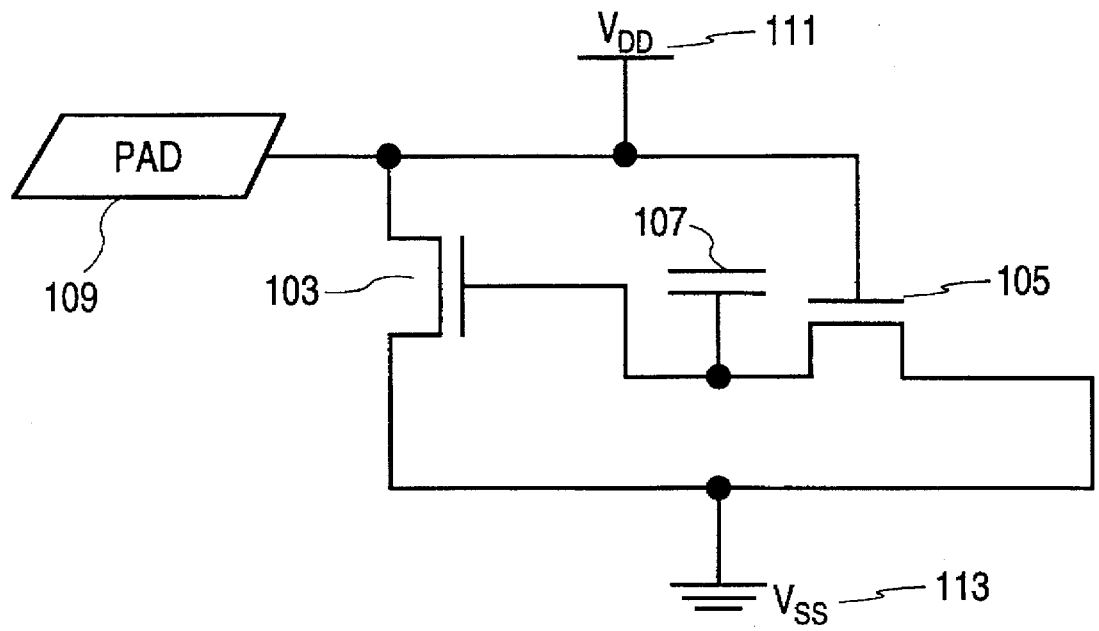
FIG. 1 is a schematic of a prior art ESD protection circuit.
Figure 2:
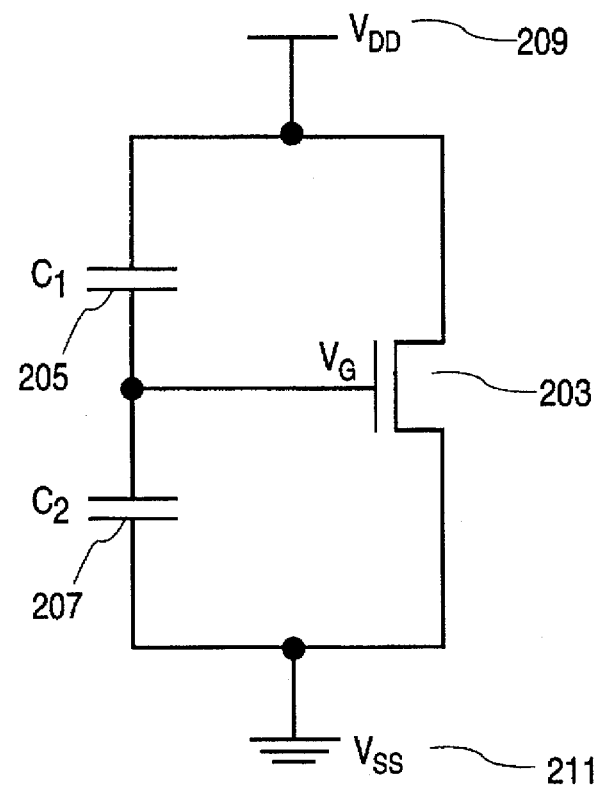
FIG. 2 is a schematic of a ESD protection circuit in accordance with the teachings of the present invention.

FIG. 2 shows an ESD protection device 201 in accordance with the teachings of the present invention. ESD protection device protects an integrated circuit (not shown) coupled between $V_{DD}$ 209 and $V_{SS}$ 211 from electrostatic discharge with n-channel transistor 203 configured as a clamp as shown in FIG. 2. Capacitors $C_1$ 205 and $C_2$ 207 are stacked between $V_{DD}$ 209 and $V_{SS}$ 211 with the gate of n-channel transistor 203 coupled between $C_1$ 205 and $C_2$ 207. With the use of static capacitive coupling as shown in FIG. 2, the gate of n-channel transistor 203 is held to a voltage based on the ratio of $C_1$ 205 to $C_2$ 207. That is, if the capacitances of the gate-to-drain ($C_1$) and gate-to-ground ($C_2$) are ratioed such that the voltage on the gate of n-channel transistor 203 were to be above threshold at the time of maximum voltage during an ESD event, the problem of the time constant associated with the prior art ESD protection circuit of FIG. 1 would be avoided. In FIG. 2, the voltage at the gate of n-channel transistor 203 is determined by the ratio of $C_1$ to $C_2$, irrespective of the speed of the ESD pulse. The voltage $V_G$ applied to the gate of n-channel transistor 203 is determined by the following equation:

$$V_G = V_{DD} \cdot \frac{C_1}{(C_1 + C_2)} \quad \text{(Equation 1)}$$

The gate coupled ESD structure shown in FIG. 2 offers the advantage of being able to fix the voltage on the gate of n-channel transistor 203 in a much more controllable manner than provided by transient gate coupled ESD protection device 101 since there is no sensitivity to the time scale of the ESD event. That is, with the static capacitive coupling shown in FIG. 2, the voltage $V_G$ applied to the gate of n-channel transistor 203 is determined according to Equation 1 above irrespective of the speed of the ESD pulse.

Figure 3:
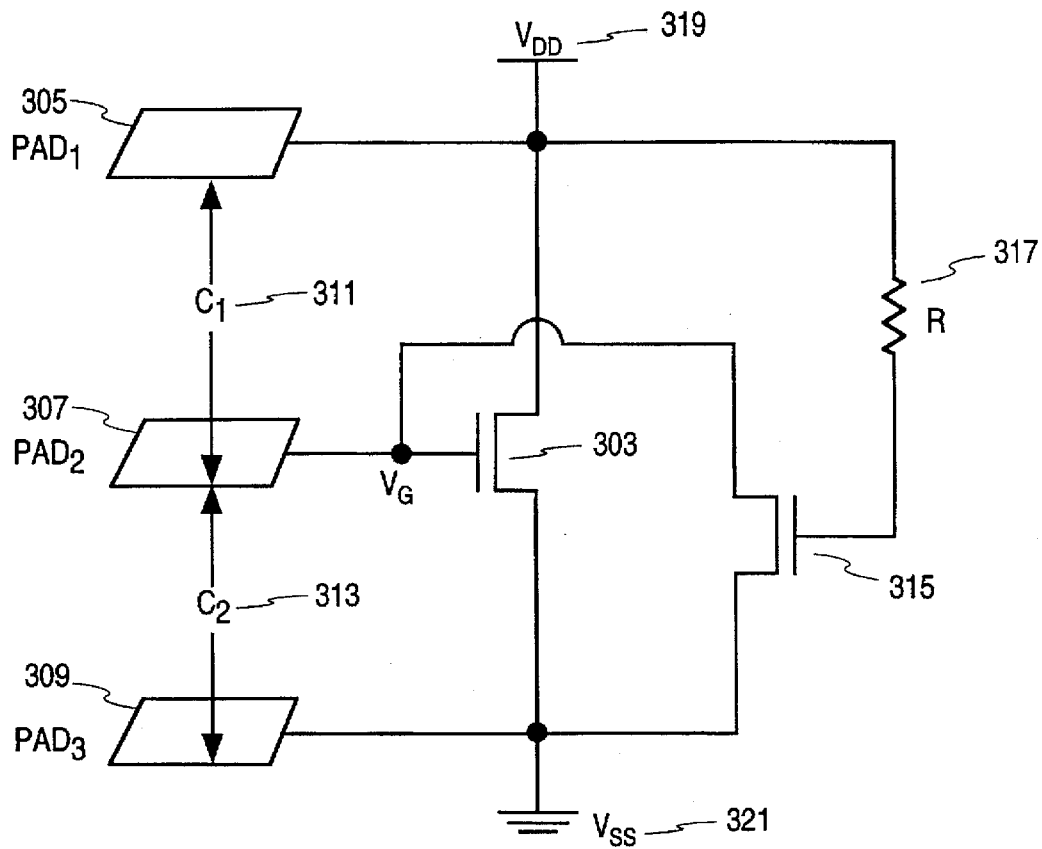
FIG. 3 is a schematic of another embodiment of an ESD protection circuit in accordance with the teachings of the present invention.

FIG. 3 is a schematic of another embodiment of an ESD protection device 301 in accordance with the teachings of the present invention. ESD protection device 301 protects an integrated circuit (not shown) from electrostatic discharge with n-channel transistor 303 configured to act as a clamp during ESD events. In one embodiment of the present invention, fixed parallel plate capacitances located under pads are used to couple up the gate of n-channel transistor 303 during an ESD event. $PAD_1$ 305, $PAD_2$ 307 and $PAD_3$ 309 are coupled to the drain gate and source of n-channel transistor 303 respectively. In one embodiment of the present invention, $PAD_1$ 305, $PAD_2$ 307 and $PAD_3$ 309 are arranged in a stacked configuration to form capacitors $C_1$ 311 and $C_2$ 313 as shown in FIG. 3. Accordingly, the voltage $V_G$ seen at the gate of n-channel transistor 303 and $PAD_2$ 307 follows the ratio of $C_1$ 311 to $C_2$ 313 in accordance with Equation 1. In one embodiment of the present invention, $C_1$ 311 and $C_2$ 313 are set to capacitances which determine the desired voltage $V_G$ at the gate of n-channel transistor 303 during an ESD event. In one embodiment of the present invention, $PAD_1$ 305, $PAD_2$ 307 and $PAD_3$ 309 are formed as bonding pads at different levels of metalization in the integrated circuit process of ESD protection device 301. This is accomplished by running metal lines at different levels such that the desired ratio of $C_1$ 311 and $C_2$ 313 is met. It is appreciated that other methods of forming $C_1$ 311 and $C_2$ 313 may be used so long as the desired ratio of $C_1$ 311 and $C_2$ 313 is realized.

It is noted that the total capacitance at the gate of n-channel transistor 303 is increased with the present invention and that $C_1$ 311 and $C_2$ 313 are adjusted to achieve the desired effect. In one embodiment of the present invention, stacked PADs 305, 307 and 309 are used so that the PAD capacitances are greater than the gate capacitance of n-channel transistor 303. It is appreciated that other layouts than the one shown in FIG. 3 may be used in accordance with the spirit and scope of the present invention so long as the desired effect is realized.

In another embodiment of the present invention, ESD protection device 301 includes n-channel transistor 315 coupled between the gate of n-channel transistor 303 and $V_{SS}$ 321. The gate of n-channel transistor 315 is coupled to $V_{DD}$ 319 through resistance R 317. N-channel transistor 315 is configured to act as a resistive element between the gate of n-channel transistor 303 and $V_{SS}$ 321 to help maintain the voltage at the gate of n-channel transistor 303 low during non-ESD events. In one embodiment of the present invention, a long channel transistor is employed to implement n-channel transistor 315. During an ESD event, the voltage $V_G$ at the gate of n-channel transistor 303 is still pulled above threshold through the capacitive coupling of capacitors $C_1$ 311 and $C_2$ 313. Eventually, however, the gate of n-channel transistor 303 is pulled back down to approximately $V_{SS}$ 321 in part through n-channel transistor 315 after the ESD event.

In sum, a method and an apparatus for protecting an integrated circuit during an electrostatic discharge event is provided. The present invention provides efficient ESD protection for an integrated circuit irrespective of the speed of the ESD pulse by providing static capacitive coupling to the gate of the n-channel transistor clamp. The ratio of the gate-to-drain and gate-to-ground static capacitances coupled to the gate of the n-channel transistor are set to maintain the gate of the n-channel transistor above threshold during the ESD event without the disadvantages of transients associated with prior art ESD protection techniques.

In the foregoing detailed description, a method and an apparatus of protecting an integrated circuit from electrostatic discharge has been described with reference to specific exemplary embodiments thereof. It will, however, be evident that various modifications and changes may be made thereto without departing from the broader spirit and scope of the present invention. The present specifications and figures are accordingly to be regarded as illustrative rather than restrictive.

What is claimed is:

1. A device for protecting an integrated circuit from electrostatic discharge, comprising:

a first transistor coupled between a first potential and a second potential;

a first capacitor having a first capacitance coupled between a gate of the first transistor and the first potential such that the gate of the first transistor is capacitively coupled to the first potential, the first capacitor including a first pad coupled to the first potential and a second pad coupled to the gate of the first transistor;

a second capacitor having a second capacitance coupled between the gate of the first transistor and the second potential such that the gate of the first transistor is further capacitively coupled to the second potential, the second capacitor including the second pad coupled to the gate of the first transistor and a third pad coupled to the second potential, wherein the gate of the first transistor is biased above a threshold voltage during an electrostatic discharge event; and, a resistive element coupled between the gate of the first transistor and the second potential, the resistive element including a second transistor coupled between the gate of the first transistor and the second potential, wherein a gate of the second transistor is coupled to the first potential.

2. The device described in claim 1 wherein the second transistor maintains a voltage approximately equal to the second potential at the gate of the first transistor during a non-electrostatic discharge event.

3. The device described in claim 1 wherein the first transistor is an n-channel transistor having a source coupled to the first potential and a drain coupled to the second potential.

4. The device described in claim 1 wherein the first potential is $V_{SS}$ and the second potential is $V_{DD}$.

5. The device described in claim 1 wherein the first and second pads are bonding pads at different levels of metallization in an integrated circuit process.

6. The device described in claim 1 wherein the second and third pads are bonding pads at different levels of metallization in an integrated circuit process.

7. A method of providing electrostatic discharge protection of an integrated circuit, the method comprising the steps of:

coupling a first transistor between a first potential and a second potential; and, biasing a gate of the first transistor to be at a voltage above a threshold voltage of the first transistor during an electrostatic discharge event, wherein the biasing step comprises the steps of:

capacitively coupling the gate of the first transistor to the first potential through a first capacitor; wherein the step of capacitively coupling the gate of the first transistor to the first potential comprises the steps of:

forming a first pad at a first level of metallization in an integrated circuit process;

coupling the first pad to the first potential;

forming a second pad at a second level of metallization in the integrated circuit process; and, coupling the second pad to the gate of the first transistor, wherein the first capacitor includes the first and second pads; and, capacitively coupling the gate of the first transistor to the second potential through a second capacitor, wherein the step of capacitively coupling the gate of the first transistor to the second potential comprises the steps of:

forming a second pad at a second level of metallization in an integrated circuit process;

coupling the second pad to the gate of the first transistor;

forming a third pad at a third level of metallization in the integrated circuit process; and, coupling the third pad to the second potential, wherein the second capacitor includes the second and third pads;

coupling the gate of the first transistor to the second potential through a second transistor; and, coupling the gate of the second transistor to the first potential.

8. The method described in claim 7 wherein a ratio of a capacitance of the first capacitor and a capacitance of the second capacitor is such that a voltage on the gate of the first transistor is above a threshold voltage during the electrostatic discharge event.

9. The method described in claim 7 further comprising the step of maintaining a voltage of the gate of the first transistor during a non-electrostatic discharge event at approximately the second potential.

10. The method described in claim 9 wherein the maintaining step comprises the step of coupling the gate of the first transistor to the second potential through the second transistor.

* * * * *